US012633240B2

(12) United States Patent
Chang et al.

(10) Patent No.:  US 12,633,240 B2
(45) Date of Patent:       May 19, 2026

(54) DISPLAY DEVICE FOR EXAMINING THE STATUS OF A GATE LINE AND INTEGRATED CIRCUIT THEREOF

(71) Applicant: NOVATEK MICROELECTRONICS CORP., Hsinchu (TW)

(72) Inventors: Yao-Chung Chang, Taichung City (TW); Chih-Chang Lai, Taichung City (TW); Yi-Cheng Yuan, New Taipei City (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 19/096,943

(22) Filed: Apr. 1, 2025

(65) Prior Publication Data

US 2025/0308418 A1      Oct. 2, 2025

Related U.S. Application Data

(60) Provisional application No. 63/572,998, filed on Apr. 2, 2024.

(51) Int. Cl.
*G09G 3/00*          (2006.01)
*G01R 31/52*        (2020.01)
*G01R 31/54*        (2020.01)

(52) U.S. Cl.
CPC ............. *G09G 3/006* (2013.01); *G01R 31/52* (2020.01); *G01R 31/54* (2020.01); *G09G 2330/12* (2013.01)

(58) Field of Classification Search
CPC .............. G09G 3/006; G09G 2330/12; G09G 2310/0286; G09G 2310/0267; G09G 3/3266; G01R 31/52; G01R 31/54
See application file for complete search history.

(56) References Cited

U.S. PATENT DOCUMENTS 11,521,534 B2 *  12/2022  Huang ..................... G09G 3/20
2020/0135153 A1 *   4/2020  Ogawa .................. G09G 3/006

* cited by examiner

*Primary Examiner* — Koosha Sharifi-Tafreshi
(74) *Attorney, Agent, or Firm* — Rosenberg, Klein & Lee

(57)                ABSTRACT

The disclosure describes a display device for examining the status of a gate line and an integrated circuit thereof. The integrated circuit includes analog front-end (AFE) circuits and first switches. The AFE circuits examine whether any one inspected gate line among the gate lines of the display panel is open-circuit or short-circuited to a non-inspected gate line. Each AFE circuit includes a non-inverting input terminal and an inverting input terminal. Each first switch includes a first terminal coupled to an inverting input terminal of a corresponding AFE circuit among the AFE circuits and a second terminal configured to couple to the display panel.

16 Claims, 6 Drawing Sheets

DISPLAY DEVICE FOR EXAMINING THE STATUS OF A GATE LINE AND INTEGRATED CIRCUIT THEREOF

CROSS-REFERENCE TO RELATED APPLICATION(S)

This disclosure claims priority to and the benefit of U.S. Provisional Application No. 63/572,998, filed on 2 Apr. 2024, which is incorporated herein by reference for all purposes

BACKGROUND OF THE INVENTION

Field of the Invention

The invention relates to display technology, particularly to a display device for examining the short-circuit/open-circuit status of a gate line of a display panel and an integrated circuit thereof.

Description of the Related Art

In conventional technology for inspecting a display panel, the display functionality is tested at two primary stages, namely a cell test stage and an integrated circuit (IC) bonding stage. At the cell test stage, the display panel is tested before the integrated circuit (IC) bonding process.

At the cell test stage, driving signals are applied to source lines and gate lines through test pads on the glass substrate of the display panel to activate the display panel, accompanying with an external backlight module. Then, automatic optical inspection (AOI) is performed to identify and eliminate defective panels by displaying simple test patterns before the IC bonding process. The IC bonding process includes a film-on-glass (FOG)/chip-on-glass (COG) process and a module-assembling process. After the IC bonding process bonding a display driver IC, additional display tests are performed. The display driver IC is driven to display complex images and the current output of the display panel is tested through test pads, to detect display abnormalities. These inspection methods rely on external testing instruments or manual verification (e.g., optical inspection, visual inspection, and current measurement). However, after a display module is integrated into a system such as an automotive display and touch integrated system, a mobile phone, or a tablet computer, any subsequent display failures cannot be directly detected by the display driver IC. Currently, in automotive display devices, human-machine interfaces (HMIs) such as the instrument cluster, infotainment system, and warning indicators are combined into a single display module. If this display module malfunctions, the driver and passengers may be not able to access critical information in real-time, posing a potential safety risk.

SUMMARY OF THE INVENTION

The invention provides a display device for examining the short-circuit/open-circuit status of a gate line of a display panel and an integrated circuit thereof, which determine whether the display panel is abnormal and is able to warn the user to reduce emergencies and increase safety.

In an embodiment of the invention, a display device includes a display panel and an integrated circuit for driving the display panel to display images. The display panel includes a plurality of gate lines, a plurality of gate driving units, and a plurality of first switches. Each gate line includes a first terminal and a second terminal opposite to the first terminal. Each gate driving unit is coupled to the first terminal of a respective one of the gate lines. The gate driving units are configured to output gate driving signals to the gate lines. The first switches correspond to the gate lines. Each first switch includes a first terminal, a second terminal and a control terminal. The control terminal of the first switch is coupled to the second terminal of a respective one of the gate lines. The integrated circuit includes a plurality of analog front-end (AFE) circuits and a plurality of second switches. Each AFE circuit includes a non-inverting input terminal and an inverting input terminal. Each second switch includes a first terminal coupled to the inverting input terminal of a corresponding AFE circuit among the plurality of AFE circuits and a second terminal configured to couple to the second terminal of a respective one of the first switches of the display panel.

In an embodiment of the invention, an integrated circuit applicable to inspecting a display panel includes a plurality of analog front-end (AFE) circuits and a plurality of first switches. The AFE circuits are configured to examine whether any one inspected gate line among the gate lines of the display panel is open-circuit or short-circuited to a non-inspected gate line. Each AFE circuit includes a non-inverting input terminal and an inverting input terminal. Each first switch includes a first terminal coupled to the inverting input terminal of a corresponding AFE circuit among the AFE circuits and a second terminal configured to couple to the display panel.

To sum up, the display device and the integrated circuit use the AFE circuits to determine whether the display panel is abnormal and is able to warn the user, thereby reducing emergencies and increasing safety.

Below, the embodiments are described in detail in cooperation with the drawings to make easily understood the technical contents, characteristics and accomplishments of the invention.

DETAILED DESCRIPTION OF THE INVENTION

Figure 1:
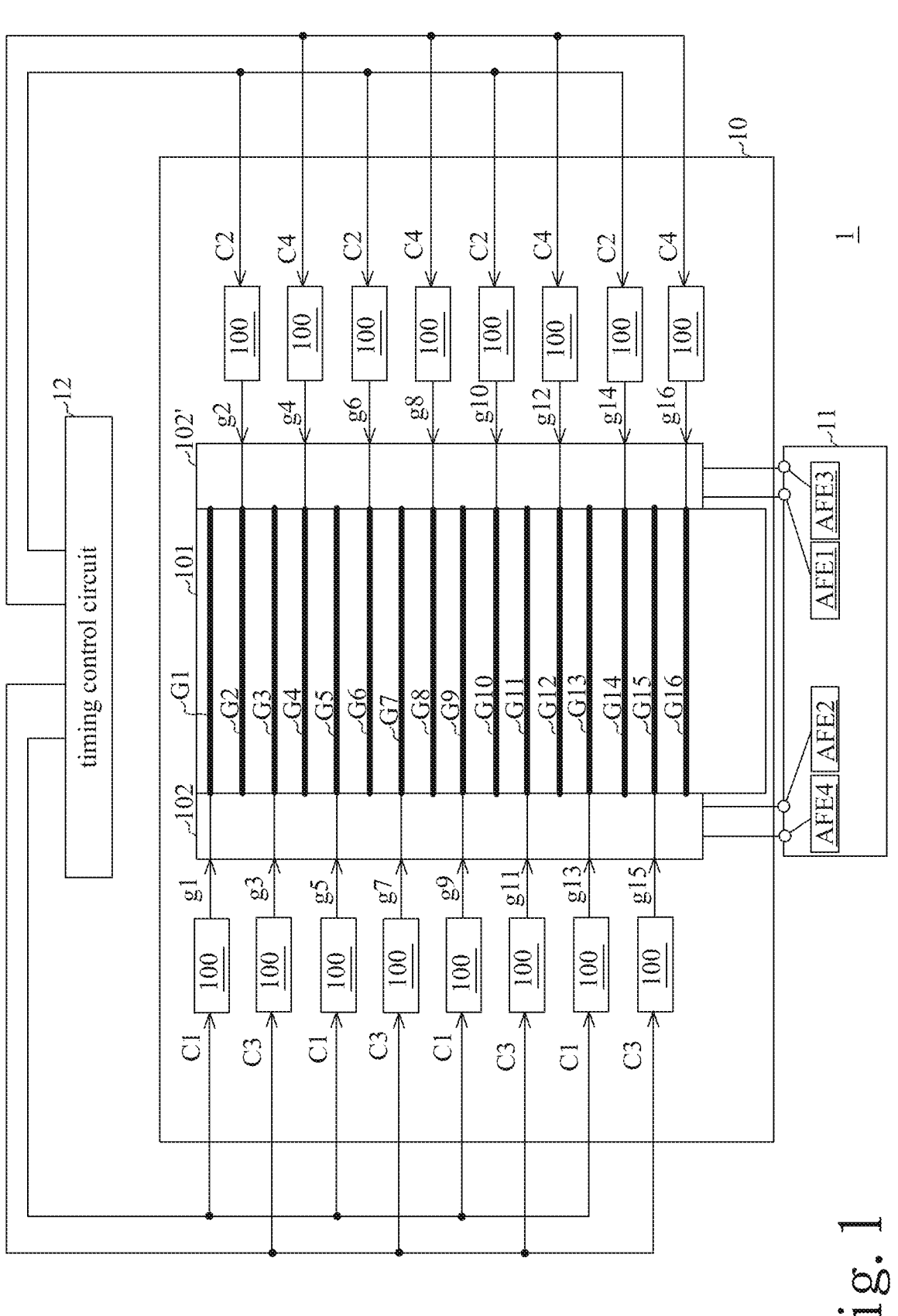
FIG. 1 is a diagram schematically illustrating a display device according to a first embodiment of the invention.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Unless otherwise specified, some conditional sentences or words, such as "can", "could", "might", or "may", usually attempt to express what the embodiment in the invention has, but it can also be interpreted as a feature, element, or step that may not be needed. In other embodiments, these features, elements, or steps may not be required.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Certain terms are used throughout the description and the claims to refer to particular components. One skilled in the art appreciates that a component may be referred to using different names. This disclosure does not intend to distinguish between components that differ in name but not in function. In the description and in the claims, the term "comprise" is used in an open-ended fashion, and thus should be interpreted to mean "include, but not limited to." The phrases "be coupled to," "couples to," and "coupling to" are intended to encompass any indirect or direct connection. Accordingly, if this disclosure mentions that a first device is coupled with a second device, it means that the first device may be directly or indirectly connected to the second device through electrical connections, wireless communications, optical communications, or other signal connections with/ without other intermediate devices or connection means.

The invention is particularly described with the following examples which are only for instance. Those skilled in the art will readily observe that numerous modifications and alterations of the device and method may be made while retaining the teachings of the invention. Accordingly, the following disclosure should be construed as limited only by the metes and bounds of the appended claims. In the whole patent application and the claims, except for clearly described content, the meaning of the articles "a" and "the" includes the meaning of "one or at least one" of the elements or components. Moreover, in the whole patent application and the claims, except that the plurality can be excluded obviously according to the context, the singular articles also contain the description for the plurality of elements or components. In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. The examples in the present specification do not limit the claimed scope of the invention.

In the following description, a display device for examining the status of a gate line of a display panel and an integrated circuit thereof will be described. The integrated circuit uses analog front-end (AFE) circuits to determine whether the display panel is abnormal (e.g., short-circuit or open-circuit) and is able to warn the user, thereby reducing emergencies and increasing safety. The integrated circuits described below may also be applied to other circuit configurations.

FIG. 1 is a diagram schematically illustrating a display device according to a first embodiment of the invention. Referring to FIG. 1, the first embodiment of a display device 1 is introduced as follows. The display device 1 includes a display panel 10, an integrated circuit (IC) 11 for driving the display panel 10 to display images, and a timing control circuit 12. The IC 11 is applicable to inspecting the display panel 10. The display panel 10 includes a plurality of gate lines, a plurality of gate driving units 100 and two switching circuits 102 and 102'. The invention is not limited to 16 gate lines. Some gate lines among the plurality of gate lines, such as gate lines G1~G16, are depicted for example. The gate lines G1~G16 are arranged in an active area 101 of the display panel 10. Each of the gate lines G1~G16 includes a first terminal and a second terminal opposite to the first terminal. Each gate driving unit 100 is coupled to the timing control circuit 12 and the first terminal of a respective one of the gate lines G1~G16. Each gate driving unit 100 is configured to generate a gate driving signal outputted to drive a corresponding gate line. The IC 11 includes a plurality of analog front-end (AFE) circuits AFE1~AFE4. The invention is not limited to four AFE circuits. The IC 11 is a display driver IC, and the timing control circuit 12 may be integrated in the IC 11 or may be a signal chip that separates from the IC 11.

Figure 2:
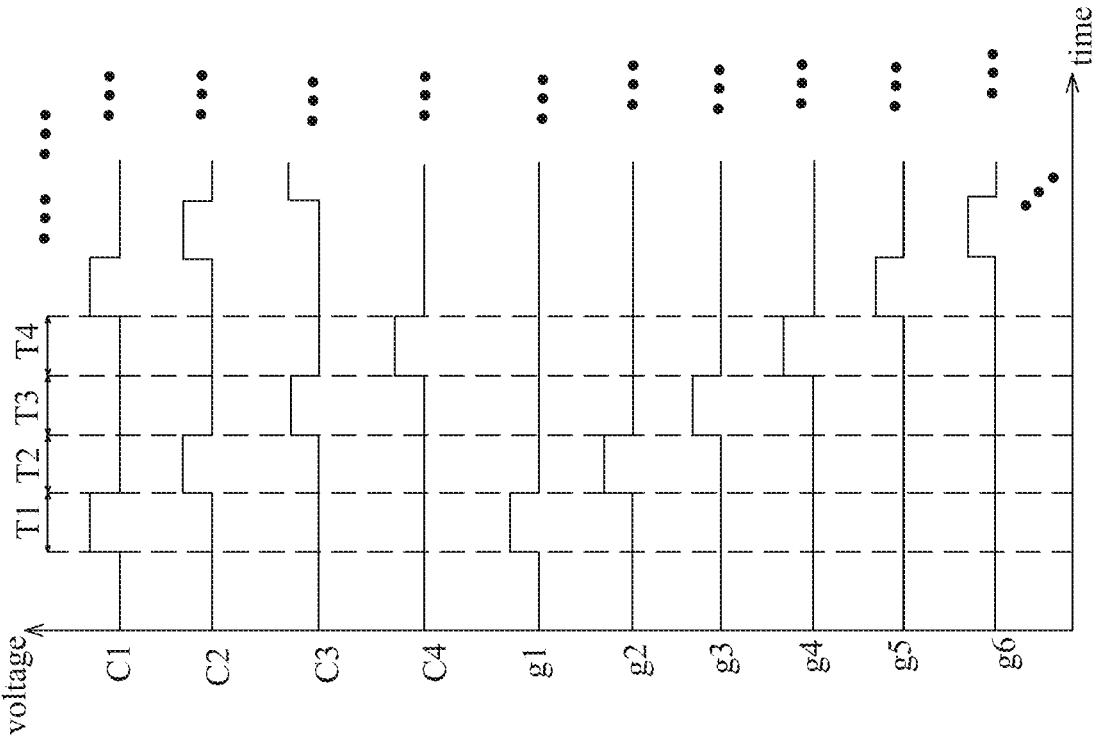
FIG. 2 is a diagram schematically illustrating the waveforms of gate control clocks and gate driving signals according to an embodiment of the invention.

FIG. 2 is a diagram schematically illustrating the waveforms of gate control clocks and gate driving signals according to an embodiment of the invention. Referring to FIG. 1 and FIG. 2, the timing control circuit 12 outputs a plurality of gate control clocks C1~C4 to the gate driving units 100. The gate driving units 100 outputs gate driving signals g1~g16 to the gate lines G1~G16 in response to the gate control clocks C1~C4. The gate control clocks C1~C4 are periodical signals having the same cycle and sequentially transit from an inactive level (such as a low voltage level) to an active level (such as a high voltage level). For example, the gate control clock C1 has a high voltage level during a period P1, the gate control clock C2 has a high voltage level during a period P2, the gate control clock C3 has a high voltage level during a period P3, and the gate control clock C4 has a high voltage level during a period P4. The gate driving signals g1, g5, 99, and g13 are generated in response to the gate control clock C1. The gate driving signals g2, g6, g10, and g14 are generated in response to the gate control clock C2. The gate driving signals g3, g7, g11, and g15 are generated in response to the gate control clock C3. The gate driving signals g4, g8, g12, and g16 are generated in response to the gate control clock C4. The gate lines G1~G16 are sequentially enabled. The AFE circuits AFE1~AFE4 examine whether any one inspected gate line G1, . . . , or G16 among the gate lines G1~G16 is open-circuit or short-circuited to the non-inspected gate line in a time period when the integrated circuit 11 does not output data voltages to the display panel 10. As a result, the AFE circuits AFE1~AFE4 can determine whether the display panel 10 is abnormal (i.e. gate lines short-circuit or open-circuit) and thus the display device 1 is able to warn the user, thereby reducing emergencies and increasing safety. For example, the porch interval of a frame period may be a time period when the integrated circuit 11 does not output data voltages to the display panel 10.

Figure 3:
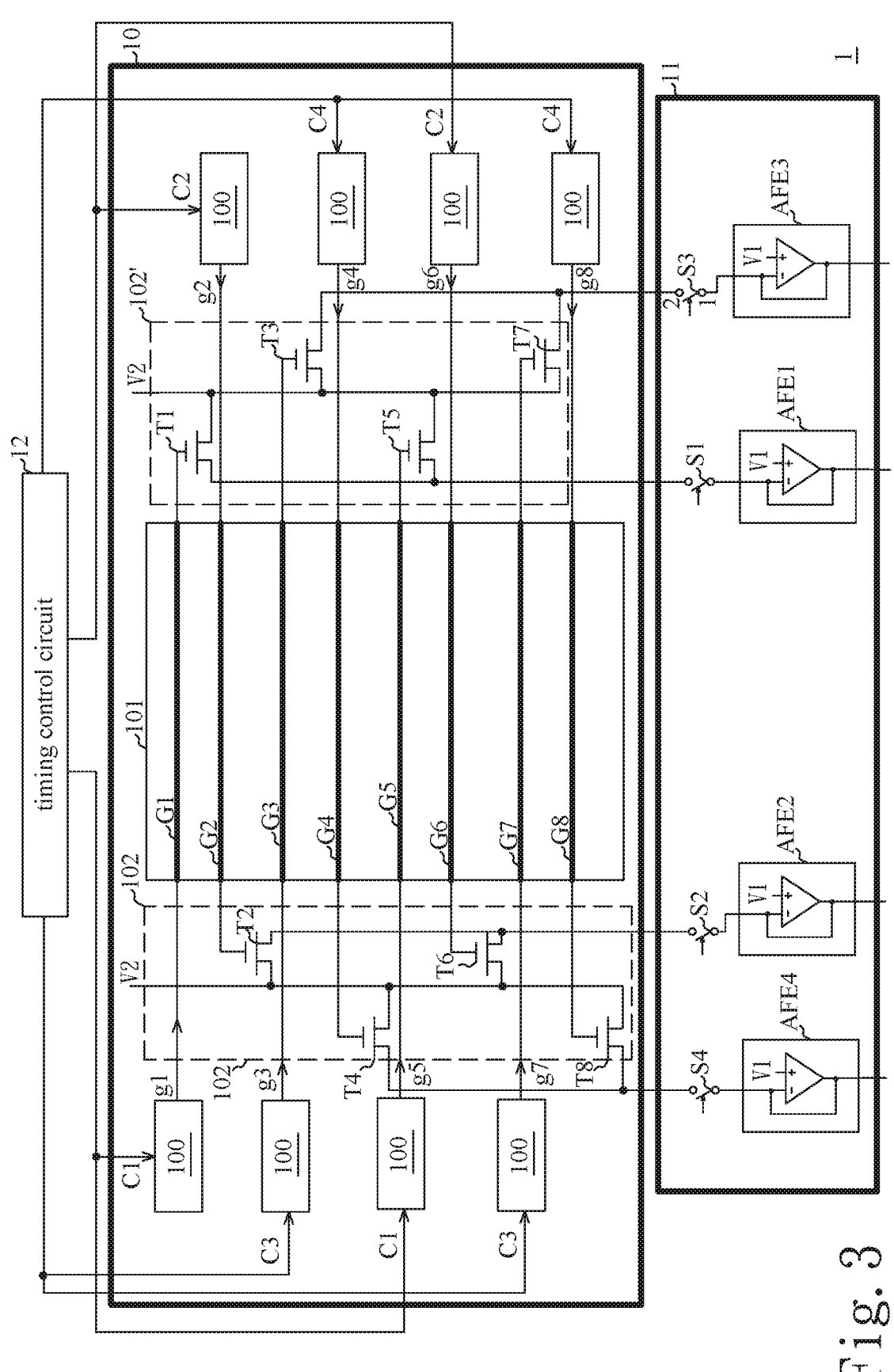
FIG. 3 is a diagram schematically illustrating a display device according to a second embodiment of the invention.

FIG. 3 is a diagram schematically illustrating a display device according to a second embodiment of the invention. Referring to FIG. 3, the display panel 10 includes 8 gate lines G1~G8, the gate driving units 100 generate 8 gate driving signals g1~g8, and the switching circuits 102 and 102' are disposed on the pixel substrate of the display panel 10. The switching circuits 102 and 102' include a plurality of switches T1~T8 such as thin film transistors. The number of the switches of the switching circuit 102 is equal to that of the switches of the switching circuit 102'. The switches T1~T8 correspond to the gate lines G1~G8. Each switch among the switches T1~T8 includes a first terminal, a second terminal and a control terminal. The control terminal of each of the switches T1~T8 is coupled to the second terminal of a respective one of the gate lines G1~G8. The IC 11 includes a plurality of analog front-end (AFE) circuits AFE1~AFE4 and a plurality of switches S1~S4. Each of the AFE circuits AFE1~AFE4 may be, but not limited to, an operational amplifier. Each of the AFE circuits AFE1~AFE4 includes a non-inverting input terminal and an inverting input terminal. The inverting input terminal and the output terminal of each of the AFE circuits AFE1~AFE4 are coupled to each other. Each of the switch S1~S4 includes a first terminal coupled to the inverting input terminal of a corresponding AFE circuit of AFE circuits AFE1, g1, AFE3, and AFE4 and a second terminal configured to couple to the second terminals of respective switches among switches T1~T8 of the display panel 10.

Figure 4:
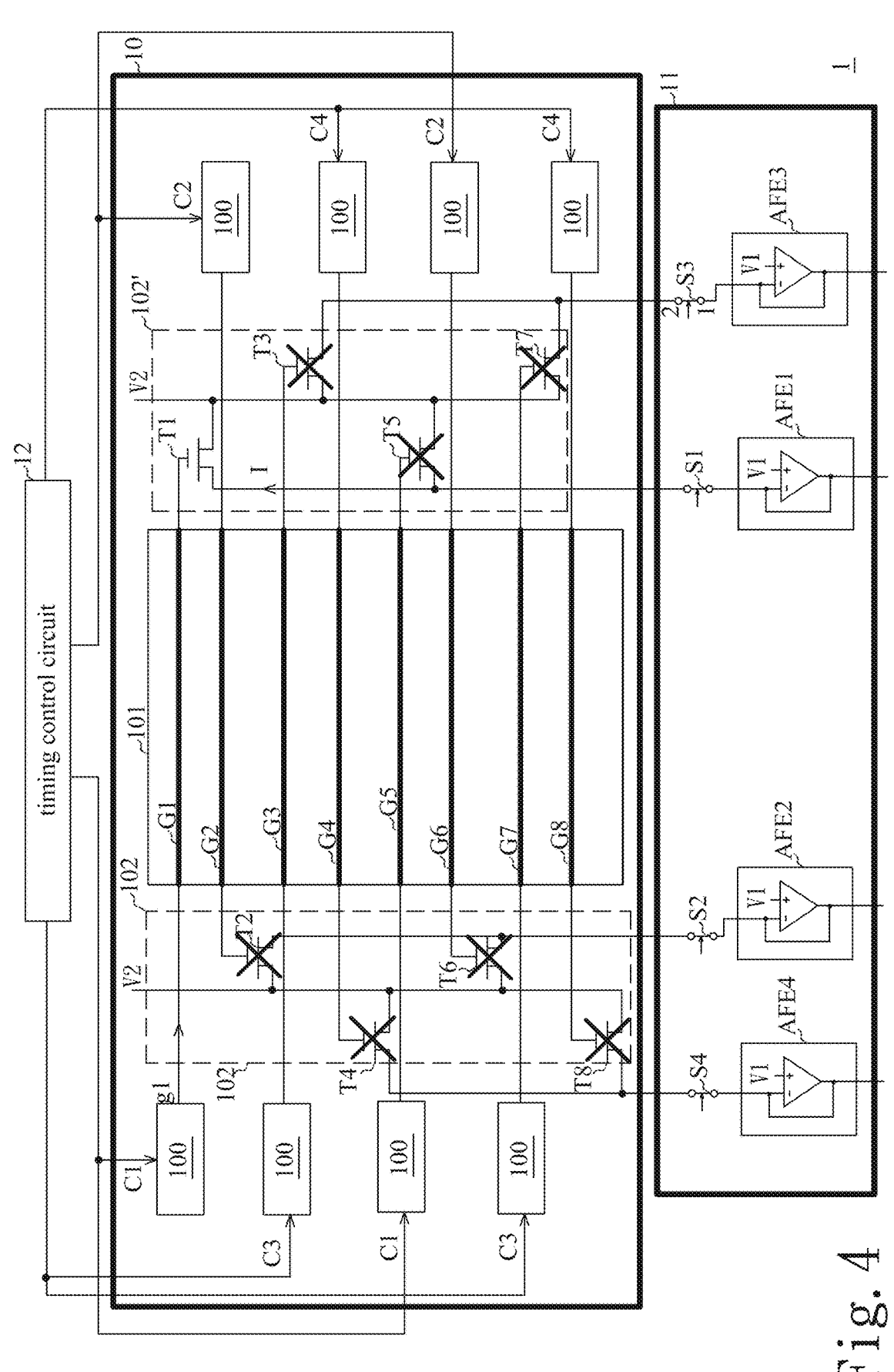
FIG. 4 is a diagram schematically illustrating a display device according to a third embodiment of the invention.

FIG. 4 is a diagram schematically illustrating a display device according to a third embodiment of the invention. Referring to FIG. 4 and FIG. 2, assume that the AFE circuit AFE1 is a first AFE circuit and that only the gate line G1 is inspected and the corresponding switch T1 is turned on for inspecting whether the inspected gate line G1 is open-circuit or short-circuited to another gate line. Meanwhile, the other switches T2~T8 are turned off. In other words, during the inspecting period of the gate line G1, the gate driving signals g2~g8 are in the low voltage level while the gate driving signal g1 is in the high voltage level. During the time period for the first AFE circuit inspecting whether the inspected gate line G1 is open-circuit or short-circuited to another gate line, the gate driving units 100 output the gate driving signals g1~g8 to the gate lines G1~G8, a voltage V2 is supplied to the first terminal of the switch T1 corresponding to the inspected gate line G1, a voltage V1 which has a different level from the voltage V2 is supplied to the non-inverting input terminal of the first AFE circuit AFE1, and the switch S1 corresponding to the AFE circuit AFE 1 is turned on. As a result of inspecting, only the first AFE circuit corresponding to the inspected gate line G1 among the AFE circuit AFE1~AFE4 detects a current I so as to output a corresponding voltage due to a closed loop that is formed in a normal state, which means the inspected gate line G1 is neither open-circuit nor short-circuited.

Figure 5:
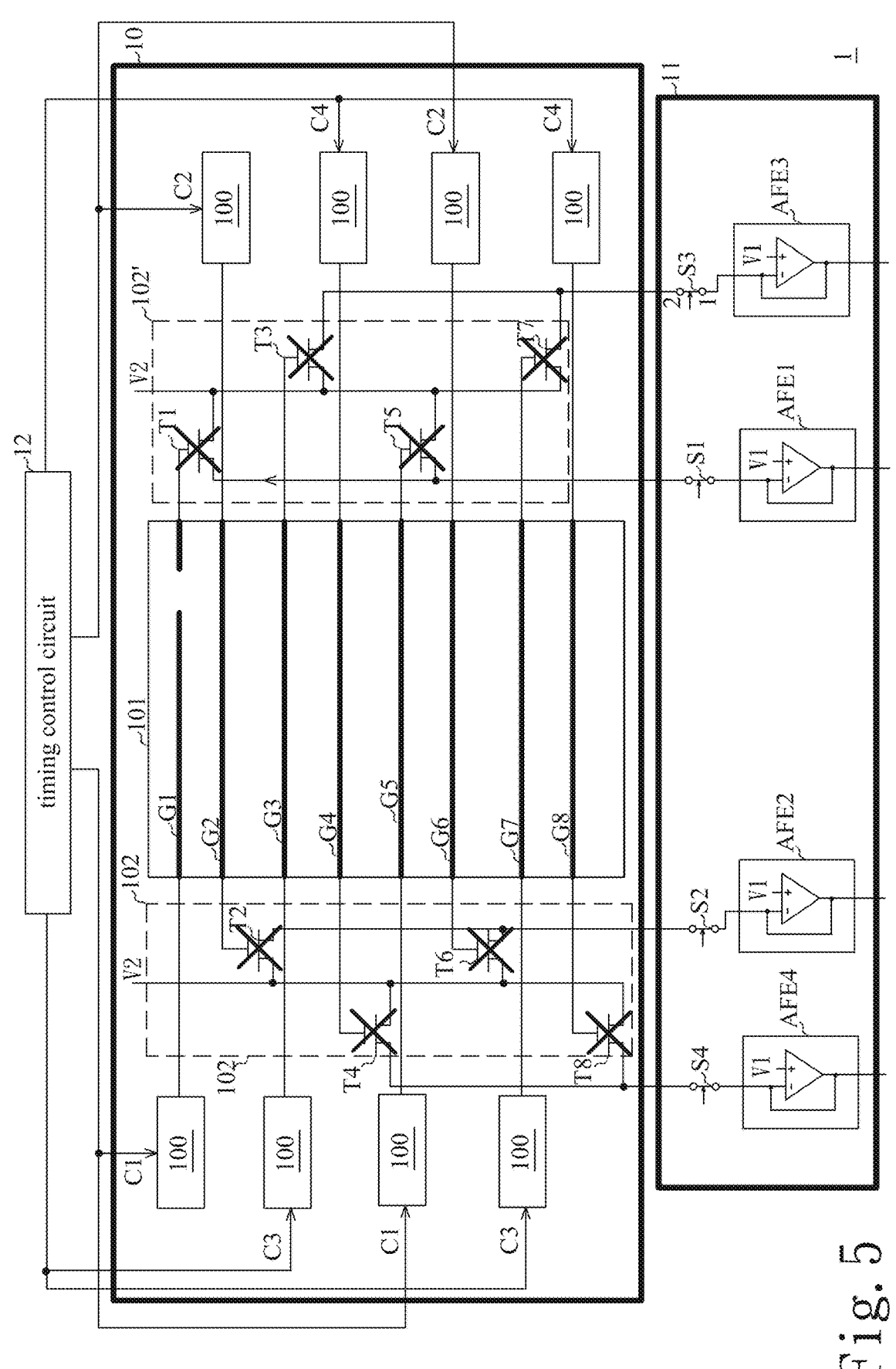
FIG. 5 is a diagram schematically illustrating a display device according to a fourth embodiment of the invention.

FIG. 5 is a diagram schematically illustrating a display device according to a fourth embodiment of the invention. Referring to FIG. 5 and FIG. 2, assume that the AFE circuit AFE1 is a first AFE circuit and that only the gate line G1 is inspected and enabled, meanwhile the gate driving signals g2~g8 stay in the low voltage level which is not able to turn on the switches T2~T8. When the inspected gate line G1 is open-circuit, the gate driving signal g1 cannot reach the control terminal of switch T1, which result in that the switch T1 is off, and as a result, a closed loop is not formed between the voltage V2 and the inverting input terminal of the first AFE circuit AFE1 and first AFE circuit AFE1 corresponding to the inspected gate line G1 detects no current.

Figure 6:
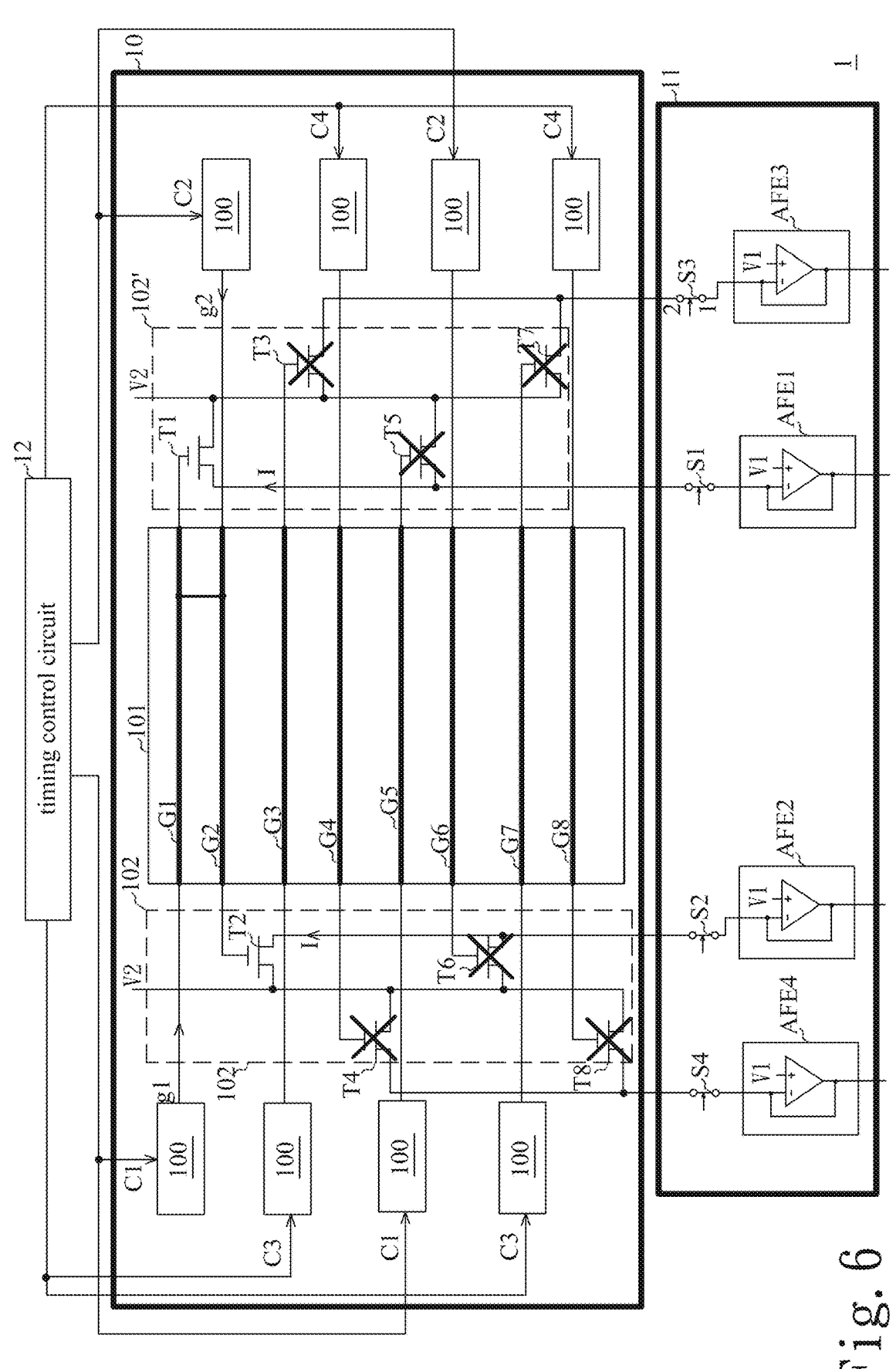
FIG. 6 is a diagram schematically illustrating a display device according to a fifth embodiment of the invention.

FIG. 6 is a diagram schematically illustrating a display device according to a fifth embodiment of the invention. Referring to FIG. 6 and FIG. 2, assume that the AFE circuit AFEL is a first AFE circuit and that only the gate line G1 is inspected and enabled, meanwhile the gate driving signals g2~g8 outputted by the gate driving units 100 are in the low voltage level which is not able to turn on the switches T2~T8. When the inspected gate line G1 is short-circuited with another gate line such as a neighboring gate line G2, the gate driving signal g1 reaches the control terminal of switch T1 and also reaches the control terminal of switch T2 through the gate line G2, and the switch T2 may be unexpectedly turned on. As a result, a close loop is formed between the voltage V2 and the inverting input terminal of the first AFE circuit AFE1 and another close loop is also formed between the voltage V2 and the inverting input terminal of the AFE circuit g1, and therefore not only the first AFE circuit corresponding to the inspected gate line G1 detects a current I but also the AFE circuit g1 (corresponding to the non-inspected gate line G2) detects a current I.

According to the embodiments provided above, the display device and the integrated circuit use the AFE circuits to determine whether the display panel is abnormal (i.e. gate lines short-circuit or open-circuit) and is able to warn the user, thereby reducing emergencies and increasing safety.

The embodiments described above are only to exemplify the invention and not to limit the scope of the invention. Therefore, any equivalent modification or variation according to the shapes, structures, features, or spirit disclosed by the invention is to be also included within the scope of the invention.

What is claimed is:

1. A display device comprising:
   a display panel comprising:
       a plurality of gate lines, each gate line comprising a first terminal and a second terminal opposite to the first terminal;
       a plurality of gate driving units, each gate driving unit being coupled to the first terminal of a respective one of the plurality of gate lines and the plurality of gate driving units configured to output gate driving signals to the gate lines; and
       a plurality of first switches corresponding to the plurality of gate lines, each first switch comprising a first terminal, a second terminal and a control terminal, wherein the control terminal of the first switch is coupled to the second terminal of a respective one of the plurality of gate lines; and
   an integrated circuit for driving the display panel to display images, the integrated circuit comprising:
       a plurality of analog front-end (AFE) circuits, each AFE circuit comprising a non-inverting input terminal and an inverting input terminal; and
       a plurality of second switches, each second switch comprising a first terminal coupled to the inverting input terminal of a corresponding AFE circuit among the plurality of AFE circuits and a second terminal configured to couple to the second terminal of a respective one of the plurality of first switches of the display panel.

2. The display device according to claim 1, wherein the plurality of AFE circuits are configured to examine whether any one inspected gate line among the plurality of gate lines is open-circuit or short-circuited to a non-inspected gate line.

3. The display device according to claim 2, wherein the plurality of AFE circuits examine whether the inspected gate line among the plurality of gate lines is open-circuit or short-circuited to a non-inspected gate line in a time period when the integrated circuit does not output data voltages to the display panel.

4. The display device according to claim 2, wherein the gate driving units output the gate driving signals to the gate lines, a first voltage is supplied to a first terminal of a first switch corresponding to the inspected gate line among the plurality of first switches, a second voltage which has a different level from the first voltage is supplied to an non-inverting input terminal of a first AFE circuit corresponding to the inspected gate line among the plurality of AFE circuits and the plurality of the second switches are turned on, when the first AFE circuit examines whether the inspected gate line is open-circuit or short-circuited to a non-inspected gate line among the plurality of gate lines.

5. The display device according to claim 2, wherein only a first AFE circuit corresponding to the inspected gate line among the plurality of AFE circuit detects a current when the inspected gate line is neither open-circuit nor short-circuited.

6. The display device according to claim 2, wherein a first switch corresponding to the inspected gate line is turned off and a first AFE circuit corresponding to the inspected gate line among the plurality of AFE circuits detects no current when the inspected gate line is open-circuit.

7. The display device according to claim 2, wherein not only a first switch corresponding to the inspected gate line is turned on but also one another first switch among the plurality of first switches is turned on and not only a first AFE circuit corresponding to the inspected gate line detects a current but also one another AFE circuit among the plurality of AFE circuits detects a current when the inspected gate line is short-circuited to a non-inspected gate line.

8. The display device according to claim 1, further comprising a timing control circuit configured to output a plurality of gate control clocks to the plurality of gate driving units.

9. An integrated circuit applicable to inspecting a display panel, comprising:

a plurality of analog front-end (AFE) circuits, configured to examine whether any one inspected gate line among a plurality of gate lines of the display panel is open-circuit or short-circuited to a non-inspected gate line, wherein each AFE circuit comprises a non-inverting input terminal and an inverting input terminal; and a plurality of first switches, each first switch comprising a first terminal coupled to the inverting input terminal of a corresponding AFE circuit among the plurality of AFE circuits and a second terminal configured to couple to the display panel.

10. The integrated circuit applicable to inspecting the display panel according to claim 9, wherein the plurality of AFE circuits examine whether any one inspected gate line among the plurality of gate lines is open-circuit or short-circuited to a non-inspected gate line in a time period when the integrated circuit does not output data voltages to the display panel.

11. The integrated circuit applicable to inspecting the display panel according to claim 9, wherein a first voltage is supplied to an non-inverting input terminal of a first AFE circuit corresponding to the inspected gate line among the plurality of AFE circuits and the plurality of the first switches are turned on when the first AFE circuit examines whether the inspected gate line is open-circuit or short-circuited to a non-inspected gate line among the plurality of gate lines.

12. The integrated circuit applicable to inspecting the display panel according to claim 11, wherein a second terminal of the first switch corresponding to the inspected gate line among the plurality of first switches is able to be coupled to a second voltage having a different level from the first voltage through a second switch disposed on the display panel.

13. The integrated circuit applicable to inspecting the display panel according to claim 9, wherein only a first AFE circuit corresponding to the inspected gate line among the plurality of AFE circuit detects a current when the inspected gate line is neither open-circuit nor short-circuited.

14. The integrated circuit applicable to inspecting the display panel according to claim 9, wherein a first AFE circuit corresponding to the inspected gate line among the plurality of AFE circuit detects no current when the inspected gate line is open-circuit.

15. The integrated circuit applicable to inspecting the display panel according to claim 9, wherein not only a first AFE circuit corresponding to the inspected gate line detects a current but also one another AFE circuit among the plurality of AFE circuits detects a current when the inspected gate line is short-circuited to a non-inspected gate line.

16. The integrated circuit applicable to inspecting the display panel according to claim 9, further comprising a timing control circuit configured to output a plurality of gate control clocks to a plurality of gate driving units.

* * * * *